(12) United States Patent
Kerofsky

(10) Patent No.: US 6,622,145 B2
(45) Date of Patent: Sep. 16, 2003

(54) HUFFMAN CODING FOR INFINITE SYMBOL SETS

(75) Inventor: Louis Joseph Kerofsky, Portland, OR (US)

(73) Assignee: Sharp Laboratories of America, Camas, WA (US)

(*) Notice: Subject to any disclaimer, the term of this patent is extended or adjusted under 35 U.S.C. 154(b) by 316 days.

(21) Appl. No.: 09/823,854

(22) Filed: Mar. 30, 2001

(65) Prior Publication Data

US 2003/0018648 A1 Jan. 23, 2003

(51) Int. Cl.[7] .................................................. G06F 7/00
(52) U.S. Cl. ........................... 707/101; 341/67; 341/107
(58) Field of Search ..................... 707/101; 340/347; 341/67, 107; 704/503

(56) References Cited

U.S. PATENT DOCUMENTS

| | | | | |
|---|---|---|---|---|
| 5,021,782 A | * | 6/1991 | Perron et al. ................... | 341/67 |
| 5,414,425 A | * | 5/1995 | Whiting et al. ................. | 341/67 |
| 5,532,694 A | * | 7/1996 | Mayers et al. .................. | 341/67 |
| 5,883,589 A | * | 3/1999 | Takishima et al. ............. | 341/67 |

* cited by examiner

Primary Examiner—Diane D. Mizrahi
Assistant Examiner—Michael Spiegel
(74) Attorney, Agent, or Firm—Marger Johnson & McCollom

(57) ABSTRACT

Methods and apparatus for constructing a grafted codebook, encoding symbols using a grafted codebook, and decoding codewords formed using a grafted codebook are disclosed. A grafted codebook is formed by piecewise modeling an input probability distribution on a number of modeling intervals, and then selecting a set of modeling distributions that minimize the redundancy of the piecewise model on the modeling intervals. An infinite code is then selected for each interval, and offsets are calculated for the codes. The codes are then merged into a grafted codebook where each code contributes codewords on its interval. The offsets are used to ensure that the resulting codebook is valid from a cumulative probability standpoint.

25 Claims, 8 Drawing Sheets

HUFFMAN CODING FOR INFINITE SYMBOL SETS

FIELD OF THE INVENTION

This present invention relates generally to lossless data compression, and more particularly to code design and code selection for infinite symbol sets.

BACKGROUND OF THE INVENTION

Lossless compression or entropy coding is used in communication and storage of digital information. In the method generally referred to as Huffman coding, see David A. Huffman, "A Method for the Construction of Minimum-Redundancy Codes", *Proc. of the IRE*, vol. 40(10), September, 1952, doc. D1, the source data is separated into symbols 20 (see FIG. 1). The entropy coder 22 of FIG. 1 represents symbols 20 as variable length bit strings 26 (i.e., codewords) looked up in a codebook 24. Compression relies on assigning short codewords to frequent symbols and reserving longer codewords for infrequent symbols. The performance of a coder depends on its ability to match the probability distribution of symbols in the source with the probability distribution corresponding to the codebook.

A fundamental codebook design problem is how to design a codebook given the probability distribution of the source. Two methods are in general use, one for "finite" codes and the other for "infinite" codes. Finite codes can represent a known number of symbols, each symbol having a known non-zero probability of occurrence. Infinite codes, on the other hand, are infinite in the sense that they are "infinitely expandable", i.e., a given infinite code can be expanded as far as needed to represent a desired set of input symbols. To be a valid infinite code, no codeword can be a prefix for any other codeword. An "infinite symbol set" is a set of symbols, which can be finite, that is represented by an infinite code.

Finite codebooks can be designed using the Huffman algorithm to generate a codebook matched to the source statistics. This algorithm constructs the set of codewords by starting from the least probable symbol and moving upward in probability. One suboptimal but reduced-complexity finite Huffman coding example is disclosed in U.S. Pat. No. 4,560,976, entitled "Data Compression" and issued Dec. 24, 1985 to Finn. Finn describes a finite codebook consisting only of one-, two-, and three-subword-long codewords. Finn uses a symbol-appearance-counting method to continuously re-rank his symbols and to decide which symbols should be assigned to which of his three lengths of codewords.

Finite-codebook methods such as those above are not well suited to infinite codes. One reason is that symbol appearance counting will not generally be able to adequately estimate the probability of occurrence of a large number of symbols having non-zero but near-zero symbol probabilities.

Several families of infinite codes have been developed based on regular structures or algorithms. Golomb codes are one such family of codes. See S. W. Golomb, "Run length encodings", *IEEE Trans. Inform. Theory*, vol. 12, pp. 399–401, July, 1966. Geometrically distributed (i.e., exponential) codes are another such family. See R. Gallager and D. C. Van Voorhis, "Optimal source codes for geometrically distributed integer alphabets", *IEEE Trans. Inform. Theory*, vol. 21, pp. 228–30, March, 1975. Other algorithmic infinite codes exist as well. See, e.g., N. Merhav et al., "Optimal Prefix Codes for Sources with Two-Sided Geometric Distributions", *IEEE Trans Inform. Theory*, vol. 46, pp. 121–35, January, 2000; N. Merhav et al., "The LOCO-I Lossless Image Compression Algorithm: Principles and Standardization into JPEG-LS", *IEEE Trans. Image Processing*, vol. 9, No. 8, August, 2000.

The regular-structured algorithmic approach provides a way to generate an infinite number of codewords but gives limited control over the resulting probability distribution. Another publication describes a method to generate an optimal codebook for an infinite distribution through a recursive sequence of calculations. A. Kato et al., "Huffman Coding with an Infinite Alphabet", *IEEE Trans. Inform. Theory* vol. 42, pp. 977–84, May, 1996. This approach serves more as a theoretical construction since the complexity of encoding and decoding this code can be significant.

An alternative to matching a probability distribution with a fixed code is to use adaptive coding. In adaptive coding, the codeword used to represent a symbol is changed dynamically while the encoder operates. Changes in the encoder are either signaled by introducing overhead, or tracked from the decoded data. Overhead subtracts from the compression efficiency, and tracking the encoder state from decoded data is error prone. In both cases, additional complexity is introduced into the encoding and decoding operations.

Arithmetic coding can also be used to efficiently code a general probability distribution but the additional complexity of an arithmetic coder can be a drawback in some applications.

SUMMARY OF THE INVENTION

The present disclosure addresses the problem of developing an infinite code tailored to a given probability distribution. Using the methods described herein, it is possible to generate a low complexity code that provides good compression performance.

Generally, the described embodiments model a given probability using a combination of two or more existing infinite codes. Codes of low complexity are preferred. For instance, two Golomb codes may be selected, one that matches the source distribution well for symbol indices near zero, and another that matches the source distribution well for large symbol indices. The two codes are "grafted" together such that the first is used for the symbol indices near zero, and the second is used for all other indices. When properly grafted as taught herein, only a few parameters are needed to describe such a distribution.

The disclosure generalizes the idea as explained simply above to accommodate a wide range of existing infinite codes and any desired number of code intervals. The described embodiments pertain generally to constructing a grafted codebook, encoding symbols using a grafted codebook, and decoding codewords formed using a grafted codebook.

BRIEF DESCRIPTION OF THE DRAWING

The invention may be best understood by reading the disclosure with reference to the drawing, wherein.

DETAILED DESCRIPTION OF THE EMBODIMENTS

Figure 1:
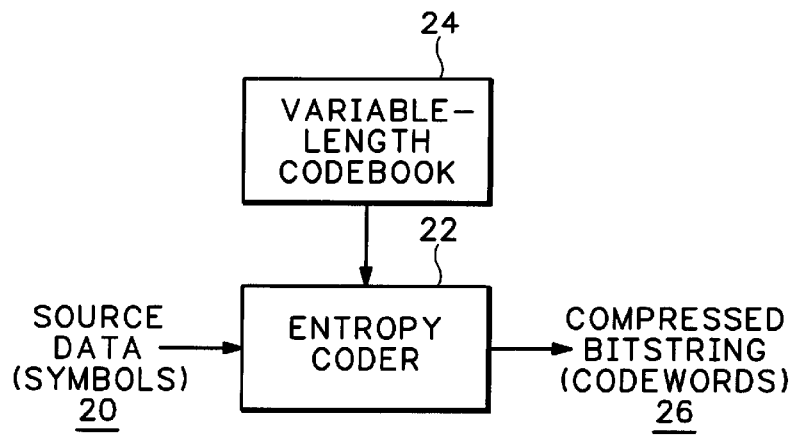
FIG. 1 illustrates the general block diagram of an entropy coder.
Figure 2:
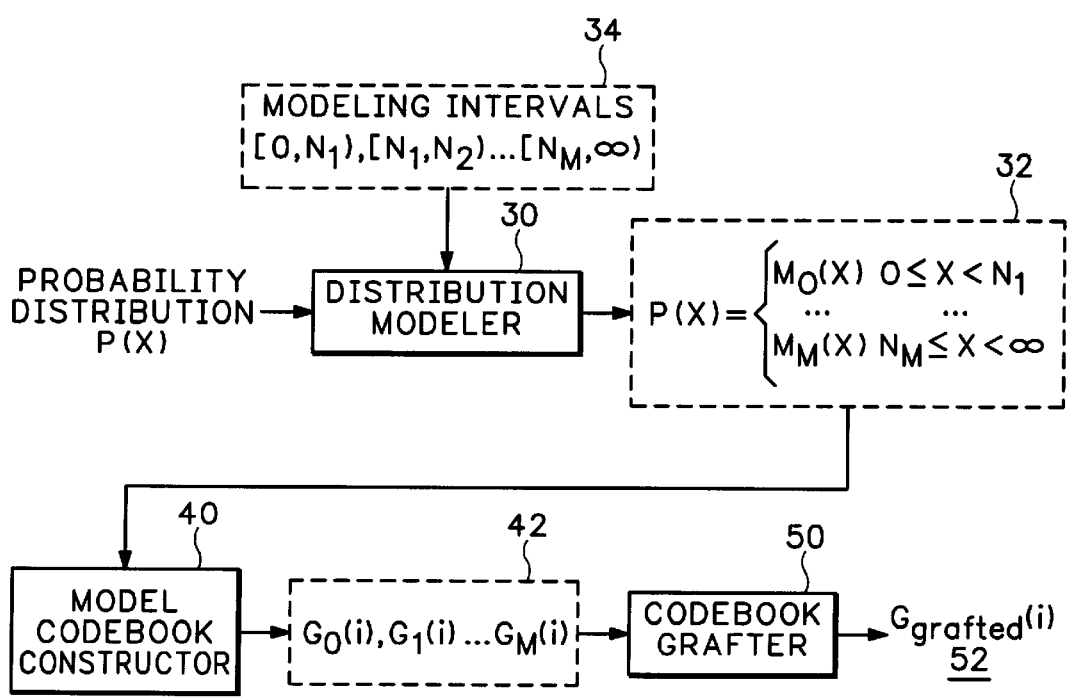
FIG. 2 shows a block diagram for a codebook generator according to an embodiment of the invention.

The following description pertains to entropy coders of the same general type shown in FIG. 1, i.e., coders that compress a sequence of symbols by using a codebook to convert symbols into variable length bit strings. The goal is to design a codebook that gives efficient compression. Three major operations are used in developing the codebook, as shown in FIG. 2. A distribution modeler 30 models an input probability distribution p(x) as a piecewise function built from a set of model distributions 32. Second, a model codebook generator 40 generates a set of codebooks, one codebook corresponding to each model distribution. A codebook grafter 50 then grafts the codebooks 40 into a single codebook 52 based on the piecewise decomposition of the original probability distribution.

The entropy of the source distribution $$E = \sum_{i=0}^{\infty} -p(i)\log_2(p(i))$$

provides a lower limit on the average bit rate per symbol in the encoder output. This is based on an ideal code that assigns $-\log_2(p(i))$ bits to the $i^{th}$ symbol. The effectiveness of coding with a model distribution $\hat{p}(i)$ is evaluated by computing the coding redundancy $$R = \sum_{i=0}^{\infty} -p(i)\log_2(\hat{p}(i)).$$

In general, $R \geq E$ for a given code, i.e., in practice the lower limit determined by the entropy E cannot be achieved. The difference, however, between the coding redundancy and the entropy determines the effectiveness of code.

Figure 3:
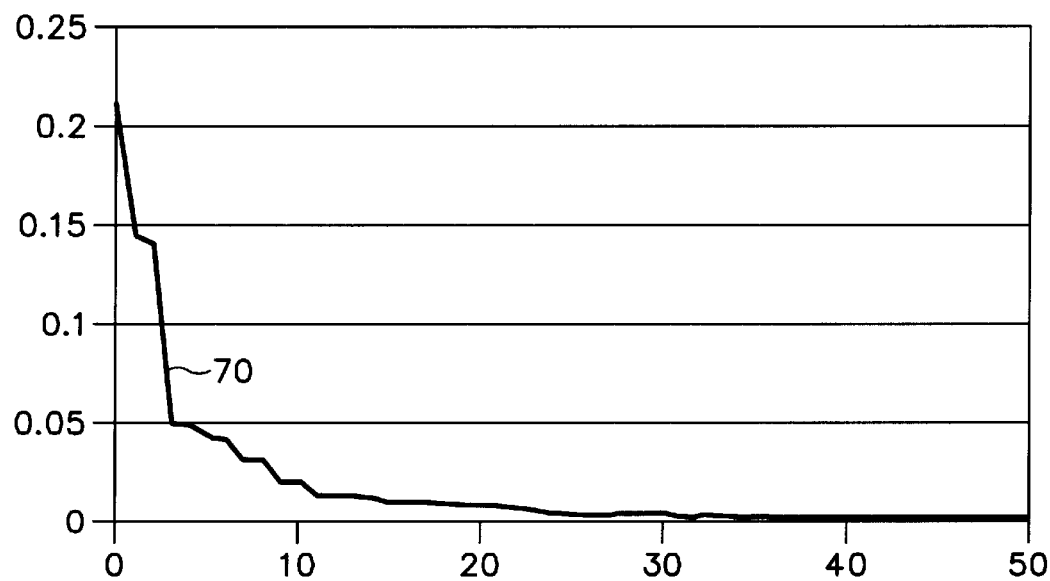
FIGS. 3 and 4 illustrate, respectively, linear and semi-log plots of a sample probability distribution used in the examples.
Figure 4:
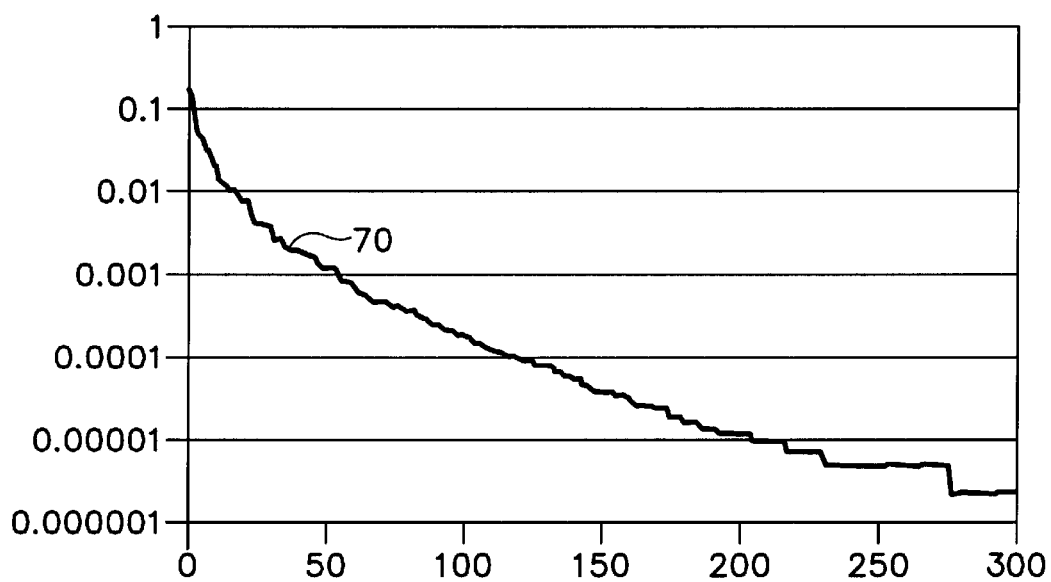

A typical sample probability distribution p(x) is illustrated as line 70 on a linear plot in FIG. 3, and on a semi-log plot in FIG. 4. The semi-log plot of FIG. 4 illustrates the asymptotic decay of the distribution. This also shows the increase in length of the ideal entropy codewords. To minimize redundancy, the model distribution $\hat{p}(i)$ should approximate the logarithm of the actual distribution p(i).

A Comparison Example-Modeling on the Entire Interval

As a comparison, a first example models the probability distribution on the entire interval $[0, \infty)$ using a single one-sided exponential distribution:

$$m_{ck}(i) = \begin{cases} (1-k) \cdot k^{(i+c)} & i \geq -c \\ 0 & i < -c \end{cases}$$

Figure 5:
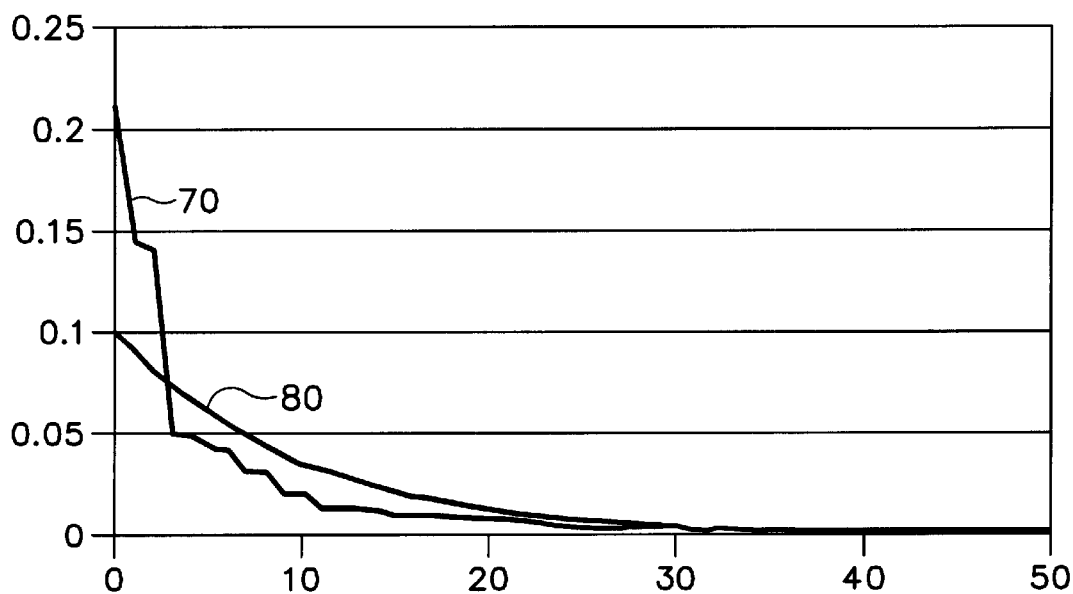
FIGS. 5 and 6 illustrate, respectively, linear and semi-log plots of a minimal redundancy exponential model of the sample probability distribution.
Figure 6:
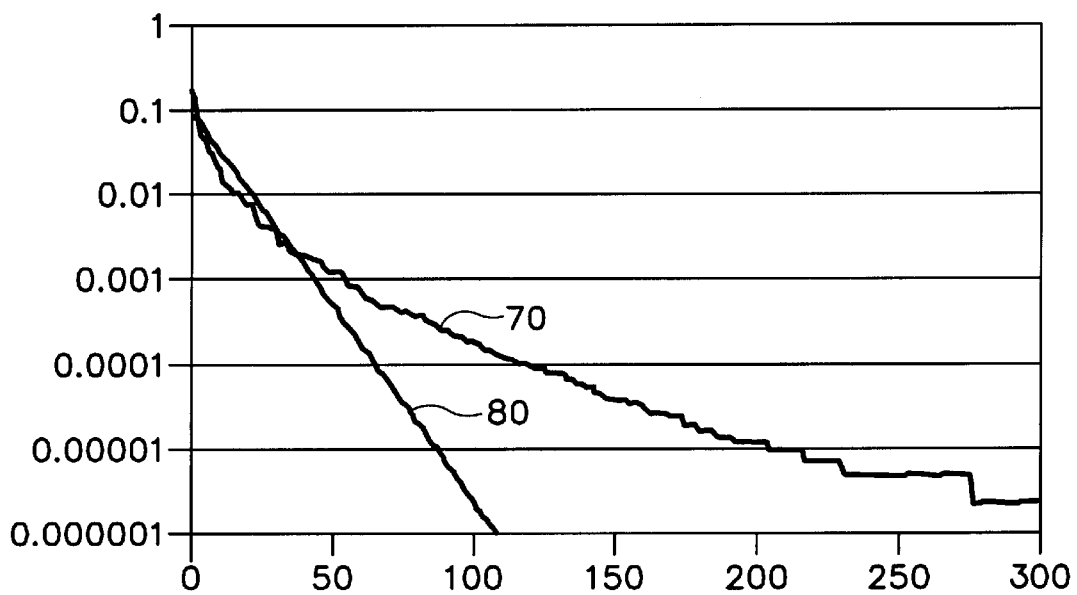

Infinite codes exist that approximate the one-sided exponential distributions. See S. W Golomb, "Run length encodings", *IEEE Trans. Inform. Theory*, vol. 12, pp. 399–401, July, 1966. The one-sided exponential distribution that gives minimal redundancy when coding the sample distribution of FIG. 3 has k=0.9 and C=0. FIG. 5 plots the sample probability distribution 70 of FIG. 3 against this minimal redundancy one-sided exponential distribution 80 on a linear plot. FIG. 6 shows the same distribution pairing on a semi-log plot.

In this example, the entropy and coding redundancy of the exponential code are Entropy=4.35985 and $R_{exponential}$=4.64767. Notice that on the semi-log plot of FIG. 6, the exponential model distribution 80 diverges significantly from the sample distribution 70, suggesting that a better model can be found. The design example below illustrates that using an embodiment of the present invention, a model distribution and a codebook for sample distribution 70 can be generated to give a lower coding redundancy than the exponential model.

Modeling the Probability Distribution

Figure 7:
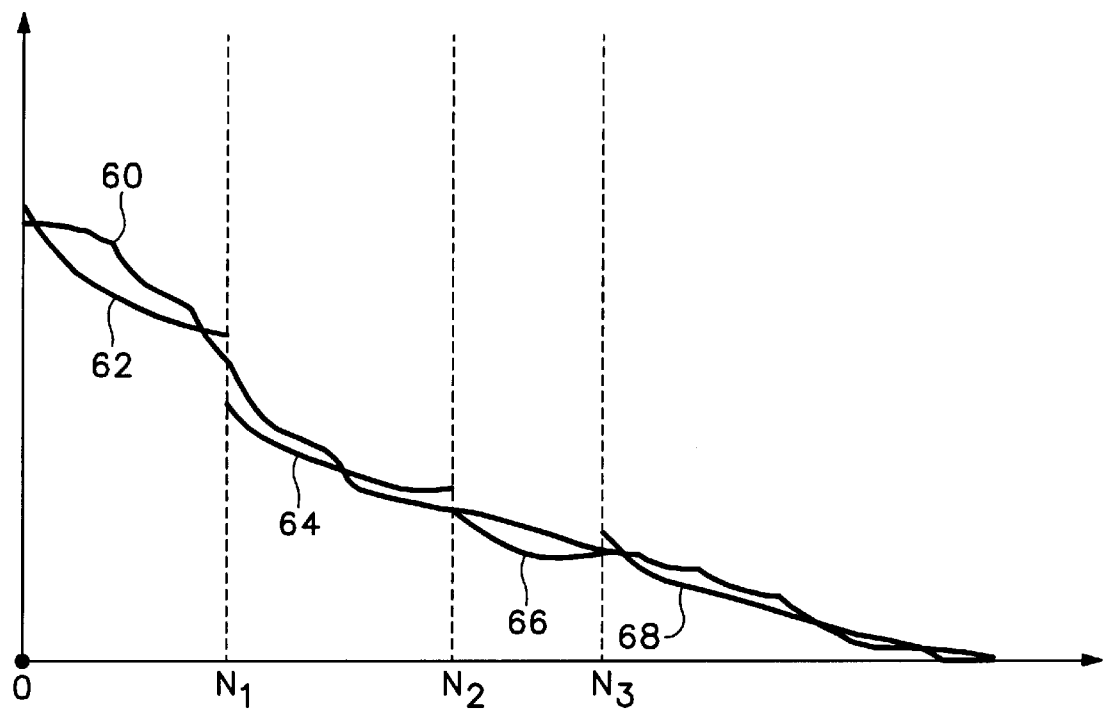
FIG. 7 illustrate a piecewise model of the sample probability distribution.

The first step in developing a code tuned to the probability distribution is designing a model of the input probability distribution. One embodiment assumes a probability distribution that is supported in $[0, \infty)$. Since in general the distribution will exhibit different characteristics on different ranges of inputs, the distribution modeler captures the behavior of the input probability distribution on these different ranges. The distribution modeler accepts (or calculates) a division of the interval $[0, \infty)$ into a set of L+1 subintervals $\{I_0, I_1, \ldots I_L\} = \{[N_0, N_1), [N_1, N_2), \ldots, [N_L, \infty)\}$ (modeling intervals 34 in FIG. 2). Distribution modeler 30 uses a family of model distributions $\{m_k(x)\}$ to construct a model of p(x) on each subinterval. As shown in FIG. 7, distribution modeler 30 models an input distribution 60 by a set of piecewise segments 62, 64, 66, 68, i.e. in general, $$p(x) \approx \hat{p}(x) = \begin{cases} m_0(x) & N_0 \leq x < N_1 \\ m_1(x) & N_1 \leq x < N_2 \\ \ldots & \ldots \\ m_L(x) & N_L \leq x < \infty. \end{cases}$$

A model distribution match is performed for each interval $[N_k, N_{k+1})$. The set of model distributions is designed to minimize the total coding redundancy of Equation 1 subject to the constraints of Equation 2.

$$R_k = \sum_{i=N_k}^{i<N_{k+1}} -p(i) \cdot \log_2(m_k(i)) \quad (1)$$

$$R_{total} = \sum_{k=0}^{k=L} R_k$$

$$\forall k \sum_{i=-\infty}^{\infty} m_k(i) = 1 \quad (2)$$

$$\sum_{k=0}^{k=L} \sum_{i=N_{k-1}}^{i<N_k} m_k(i) = 1$$

Minimization of the coding redundancy requires that a modeling function $m_k(x)$ cannot be zero at any point in its interval $N_k$ where $p(x)$ is non-zero. The first constraint equation requires each model function to give a unit probability over the entire interval. The second constraint equation requires the piecewise model to give a unit probability over the entire interval. Distribution modeler 30 preferably generates the model distributions 32 by minimizing the total coding redundancy subject to these constraints.

Model Codebooks

In the previous step a model of the probability distribution 70 was determined using a piecewise collection of model distributions. With the model distributions specified, a code $C_k(i)$ is developed for each model distribution. The codebook corresponding to each model distribution is preferably computed based on an existing infinite code. Codes with low encoding and decoding complexity can be used for the model distributions to limit the complexity of the resulting code.

As an example, the family of Golomb codes, $\{G_m(i)\}$, can be used. Details on these codes can be found in S. W. Golomb, "Run length encodings", *IEEE Trans. Inform. Theory*, vol. 12, pp. 399–401, July, 1966; R. Gallager and D. C. Van Voorhis, "Optimal source codes for geometrically distributed integer alphabets", *IEEE Trans. Inform. Theory*, vol. 21, pp. 228–30, March, 1975; N. Merhav et al., "Optimal Prefix Codes for Sources with Two-Sided Geometric Distributions", *IEEE Trans Inform. Theory*, vol. 46, pp. 121–35, January, 2000. A brief summary of Golomb codes is given below.

Each Golomb code in the family is defined by a single parameter m. The codewords of $G_m$ have a regular structure. Each codeword is formed from a prefix and a suffix. The $i^{th}$ codeword is formed by selecting prefix i/m and suffix i%m. Prefix i/m is the unary representation of 1 using i/m bits. For the suffix corresponding to each prefix, there are m distinct values representing the binary representations of the possible remainders i%m. The number of bits used to represent each suffix depends on m and i%m, but for each code only m distinct suffix values are used. Sample prefix and suffix values are shown in Table 1. Codebooks for the first 8 Golomb codes are shown in Table 2.

TABLE 1

Prefixes and Suffixes of Golomb codes $G_m(i)$.

| Prefix values | Suffix (m = 3) | Suffix (m = 4) | Suffix (m = 8) |
|---|---|---|---|
| 1 | 0 | 00 | 000 |
| 01 | 10 | 01 | 010 |
| 001 | 11 | 10 | 010 |
| 0001 | — | 11 | 011 |
| 00001 | — | — | 100 |
| . . . | | | 101 |
| | | | 110 |
| | | | 111 |

TABLE 2

Sample Golomb Codebooks

| index | $G_2$ | $G_3$ | $G_4$ | $G_5$ | $G_6$ | $G_7$ | $G_8$ |
|---|---|---|---|---|---|---|---|
| 0 | 10 | 10 | 100 | 100 | 100 | 100 | 1000 |
| 1 | 11 | 110 | 101 | 101 | 101 | 1010 | 1001 |
| 2 | 010 | 111 | 110 | 110 | 1100 | 1011 | 1010 |
| 3 | 011 | 010 | 111 | 1110 | 1101 | 1100 | 1011 |
| 4 | 0010 | 0110 | 0100 | 1111 | 1110 | 1101 | 1100 |
| 5 | 0011 | 0111 | 0101 | 0100 | 1111 | 1110 | 1101 |
| 6 | 00010 | 0010 | 0110 | 0101 | 0100 | 1111 | 1110 |
| 7 | 00011 | 00110 | 0111 | 0110 | 0101 | 0100 | 1111 |
| 8 | 000010 | 00111 | 00100 | 01110 | 0100 | 01010 | 01000 |
| 9 | 000011 | 00010 | 00101 | 01111 | 0101 | 01011 | 01001 |
| 10 | 0000010 | 000110 | 00110 | 00100 | 0110 | 01100 | 01010 |
| . . . | . . . | . . . | . . . | . . . | . . . | . . . | . . . |

In one embodiment, the model codebook constructor 40 of FIG. 2 selects a different Golomb code for each of the model distributions 32, e.g., the Golomb code best matching the input distribution on each modeling interval.

Codebook Grafting

The codebooks $C_k(i)$ corresponding to the model distributions are merged into a single codebook. The codebooks are merged by taking the section of codebook $C_k(i)$ that corresponds to the symbols in interval $I_k=[N_k, N_{k+1})$. The interval $I_k$ contributes $N_{k+1}-N_k$ codewords to the grafted codebook. The codewords are selected from the codebook $C_k(i)$ using an offset $O_k$. The grafted codebook is defined by selecting segments from each of the model codebooks via $C(i)=C_j(i+O_j)$ where $i \ni I_j$. The offsets are computed recursively using the cumulative probability of the preceding intervals $[0, N_k)$. The first offset $O_0$ is zero and successive offsets are computed recursively by solving the following for $O_k$:

$$\sum_{i=0}^{i<N_k+O_k} \left(\frac{1}{2}\right)^{\|C_k(i+O_k)\|} = \sum_{j=0}^{j=k-1} \sum_{i=N_j}^{i<N_{j+1}} \left(\frac{1}{2}\right)^{\|C_j(i+O_j)\|} \approx \sum_{i=0}^{i<N_k} \hat{p}(i)$$

The norm $\|C_j(i+O_j)\|$ denotes the length of codeword $i+O_j$ in code j. The following example of combining codebooks uses the intervals $[0,2)$, $[2,4)$, and $[4, \infty)$, with a respective selection for each interval of the Golomb codes $G_2$, $G_4$ and $G_7$. Table 3 shows the first few elements for the Golomb codes $G_2$, $G_4$ and $G_7$.

TABLE 3

Golomb Model Codes

| index | $G_2$ | $G_4$ | $G_7$ |
|---|---|---|---|
| 0 | 10 | 100 | 100 |
| 1 | 11 | 101 | 1010 |
| 2 | 010 | 110 | 1011 |
| 3 | 011 | 111 | 1100 |
| 4 | 0010 | 0100 | 1101 |
| 5 | 0011 | 0101 | 1110 |
| 6 | 00010 | 0110 | 1111 |
| 7 | 00011 | 0111 | 0100 |
| 8 | 000010 | 00100 | 01010 |
| 9 | 000011 | 00101 | 01011 |
| 10 | 0000010 | 00110 | 01100 |
| 11 | 0000011 | 00111 | 01101 |
| 12 | 00000010 | 000100 | 01110 |
| 13 | 00000011 | 000101 | 01111 |
| 14 | 000000010 | 000110 | 00100 |
| ... | ... | ... | ... |

To determine the offsets, the codebook grafter computes the cumulative probability functions corresponding to each code. Since offset $O_0$ is zero, the cumulative probability for calculating offset $O_1$ the cumulative probability up to and including $G_2(1)$, i.e., 0.50 as shown in Table 4. Examining the cumulative probabilities of $G_2$ and $G_4$ in Table 4, it can be seen that the cumulative probability of $G_4(3)$ is equal to the cumulative probability of $G_2(1)$, therefore $O_1=2$ the first codeword selected from $G_4$ is $G_4(4)$. Likewise, the cumulative probability for calculating offset $O_2$ is the cumulative probability up to and including the last codeword selected from $G_4(G_4(5))$, i.e., 0.50 as shown in Table 4. Examining the cumulative probabilities of $G_4$ and $G_7$ in Table 4, it can be seen that the cumulative probability of $G_7(9)$ is equal to the cumulative probability of $G_4(5)$, therefore $O_2=6$ and the first codeword selected from $G_7$ is $G_7(10)$.

TABLE 4

Cumulative Probability of Model Codes

| index | $G_2$ | $G_4$ | $G_7$ |
|---|---|---|---|
| 0 | 0.25 | 0.13 | 0.13 |
| 1 | 0.50 | 0.25 | 0.19 |
| 2 | 0.63 | 0.38 | 0.25 |
| 3 | 0.75 | 0.50 | 0.31 |
| 4 | 0.81 | 0.56 | 0.38 |
| 5 | 0.88 | 0.63 | 0.44 |
| 6 | 0.91 | 0.69 | 0.50 |
| 7 | 0.94 | 0.75 | 0.56 |
| 8 | 0.95 | 0.78 | 0.59 |
| 9 | 0.97 | 0.81 | 0.63 |
| 10 | 0.98 | 0.84 | 0.66 |
| 11 | 0.98 | 0.88 | 0.69 |
| 12 | 0.99 | 0.89 | 0.72 |
| 13 | 0.99 | 0.91 | 0.75 |
| 14 | 0.99 | 0.92 | 0.78 |
| 15 | 1.00 | 0.94 | 0.80 |
| ... | ... | ... | ... |

Table 5 shows the grafted codebook formed from $G_2$, $G_4$, and $G_7$ using the offsets $O_0$, $O_1$, and $O_2$.

TABLE 5

Grafted Codebook

| index | Codebook $G_m$ | Offset $O_k$ | $i + O_k$ | $C_{grafted}$ |
|---|---|---|---|---|
| 0 | 2 | 0 | 0 | 10 |
| 1 | 2 | 0 | 1 | 11 |
| 2 | 4 | 2 | 4 | 0100 |
| 3 | 4 | 2 | 5 | 0101 |
| 4 | 7 | 6 | 10 | 01100 |
| 5 | 7 | 6 | 11 | 01101 |
| 6 | 7 | 6 | 12 | 01110 |
| 7 | 7 | 6 | 13 | 01111 |
| 8 | 7 | 6 | 14 | 00100 |
| 9 | 7 | 6 | 15 | 001010 |
| 10 | 7 | 6 | 16 | 001011 |
| ... | ... | ... | ... | ... |

Complete Codebook Design Example

The following example illustrates a grafted codebook design for the sample distribution 70 presented earlier. The interval $[0, \infty)$ is divided into two subintervals $[0, \infty)=[0, 3)\cup[3, \infty)$ at the distribution modeler. The distribution will be modeled by a piecewise function built from two distribution functions.

$$p(x) = \begin{cases} m_0(x) & 0 \leq x < 3 \\ m_1(x) & 3 \leq x \end{cases}$$

The model distributions were chosen from the family of one-sided exponential distributions:

$$m_j(i) = \begin{cases} (1-k) \cdot k_j^{(i+C_j)} & i \geq -c_j \\ 0 & i < -c_j \end{cases}$$

The constraint on the cumulative probability becomes:

$$\sum_{i=0}^{2} p(i) \cdot (1-k_0) k_0^{(i+C_0)} + \sum_{i=3}^{\infty} p(i) \cdot (1-k_1) k_1^{(i+C_1)} = 1 \quad (3)$$

The coding redundancy becomes:

$$R(C_0, k_0, C_1, k_1) = \qquad (4)$$
$$\sum_{i=0}^{2} -p(i)\log_2\left((1-k_0)k_0^{(i+C_0)}\right) + \sum_{i=3}^{\infty} -p(i)\log_2\left((1-k_1)k_1^{(i+C_1)}\right)$$

A small search through the parameter space ($C_0$, $k_0$, $C_1$, $k_1$) was conducted to minimize the redundancy of Equation 4 subject to the constraint of Equation 3. To reduce the search space, the parameters were restricted so that $C_0=0$ and $$k_0, k_1 \in \left\{ \left(\frac{1}{2}\right)^{\frac{1}{m}} \middle| m \in \{2, 4, 8\} \right\}$$

with the value of C1 determined by the constraint of Equation 3. The search resulted in parameters $$(C_0, k_0, C_1, k_1) = \left(0, \left(\frac{1}{2}\right)^{\frac{1}{4}}, 12, \left(\frac{1}{2}\right)^{\frac{1}{8}}\right).$$

Figure 8:
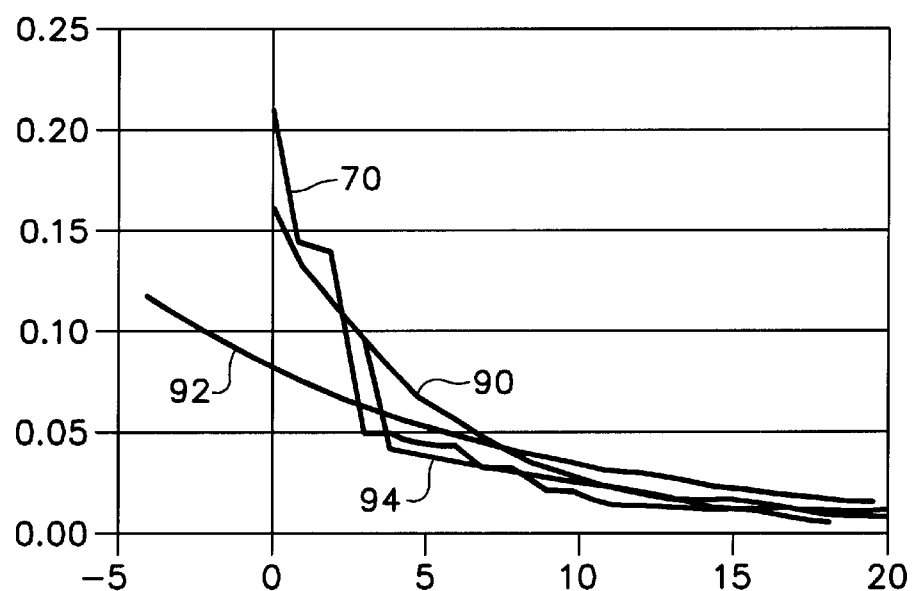
FIGS. 8 and 9 illustrate, respectively, linear and semi-log plots of a grafted code probability distribution generated according to an embodiment of the invention.
Figure 9:
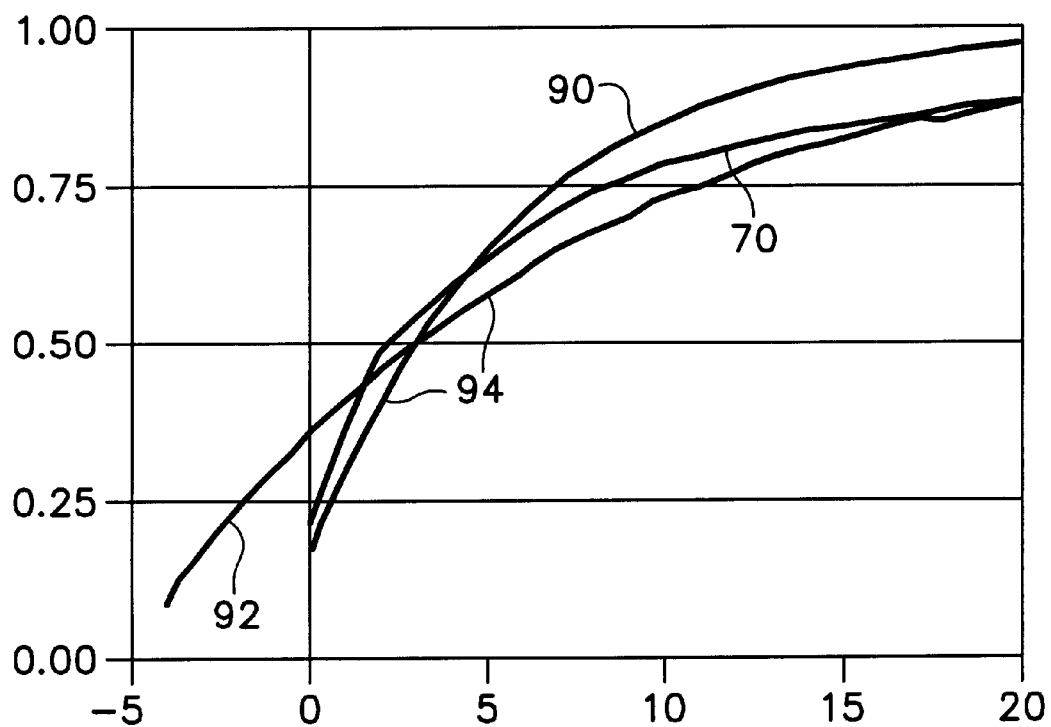

The corresponding probability distributions and cumulative distributions are shown respectively in FIGS. 8 and 9, where 70 is the original distribution, 90 is model distribution $m_0$, 92 is model distribution $m_1$, and 94 is the final grafted distribution.

Figure 10:
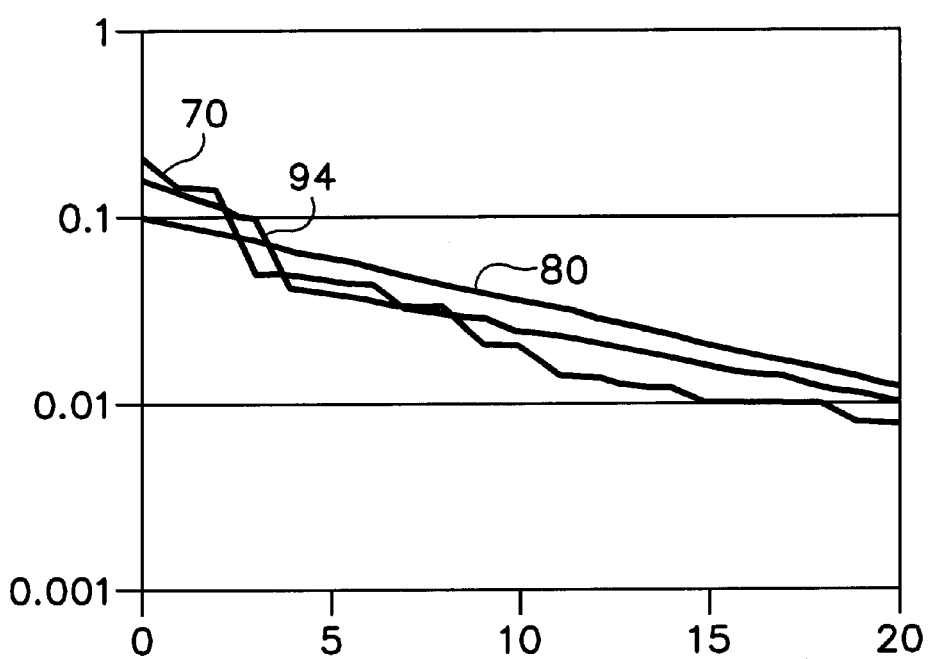
FIG. 10 contains a plot contrasting the original sample probability distribution, the minimal redundancy exponential model, and the grafted code probability distribution of FIGS. 8 and 9.

The semi-log plot of FIG. 10 compares the original distribution 70, the exponential model distribution 80 developed in the comparative example, and the grafted model distribution 94.

The Golomb codes $G_4$ and $G_8$ are used with these model distributions. These codes were presented earlier in Table 2. The offset $O_1=3$ used to access $G_8$ is determined by solving Equation 5:

$$\sum_{i=0}^{i<3+O_1} \left(\frac{1}{2}\right)^{\|G_8(i)\|} = \sum_{i=0}^{i<3} \left(\frac{1}{2}\right)^{\|G_4(i)\|} \quad (5)$$

Table 6 shows the cumulative distribution functions corresponding to $G_4$ (i.e., $m_0$) and $G_8$ (i.e., $m_1$). The right hand side of Equation 5 corresponds to the third element of column $m_0$ of Table 6, i.e., the sum of the first three probabilities of $G_4$ is 0.405396. The left hand side of Equation 5 corresponds to column $m_1$ of Table 6. As can be seen, the sum of the first six probabilities of $G_8$ is also 0.405396, therefore Equation 5 is satisfied for $O_1=3$. Thus the grafted codebook consists of the first three elements of $G_4$, followed by elements from $G_8$ starting the seventh element. The first six elements of $G_8$ are skipped in order to satisfy the constraint that the cumulative probability must equal one. The grafted codebook is shown in Table 7.

TABLE 6

Cumulative Distributions

| m0 | m1 |
|---|---|
| 0.159104 | 0.082996 |
| 0.292893 | 0.159104 |
| 0.405396 | 0.228895 |
| 0.500000 | 0.292893 |
| 0.579552 | 0.351580 |
| 0.646447 | 0.405396 |
| 0.702698 | 0.454746 |
| 0.750000 | 0.500000 |
| 0.789776 | 0.541498 |
| 0.823223 | 0.579552 |
| 0.851349 | 0.614447 |
| ... | ... |

TABLE 7

Grafted Codebook

| index | Codebook $G_m$ | Offset $O_k$ | i + $O_k$ | $C_{grafted}$ |
|---|---|---|---|---|
| 0 | 4 | 0 | 0 | 100 |
| 1 | 4 | 0 | 1 | 101 |
| 2 | 4 | 0 | 2 | 110 |
| 3 | 8 | 3 | 6 | 1110 |
| 4 | 8 | 3 | 7 | 1111 |
| 5 | 8 | 3 | 8 | 01000 |
| 6 | 8 | 3 | 9 | 01001 |

TABLE 7-continued

Grafted Codebook

| index | Codebook $G_m$ | Offset $O_k$ | i + $O_k$ | $C_{grafted}$ |
|---|---|---|---|---|
| 7 | 8 | 3 | 10 | 01010 |
| 8 | 8 | 3 | 11 | 01011 |
| 9 | 8 | 3 | 12 | 01100 |
| 10 | 8 | 3 | 13 | 01101 |
| ... | ... | ... | ... | ... |

This model constructed by grafting the Golomb codes of order 4 and 8 results in a coding redundancy of $R_{grafted}=$ 4.47367. For comparison, the results of coding the sample distribution with several codes are illustrated in Table 8.

TABLE 8

Coding Redundancies

| Code | Entropy | Exponential | Grafted | $G_4$ | $G_8$ |
|---|---|---|---|---|---|
| Redundancy | 4.35985 | 4.64767 | 4.47367 | 4.83241 | 4.68104 |

In Table 8, the entropy represents the lower limit. The exponential entry is the redundancy of the exponential model. Any code developed based on this model will have a slightly higher redundancy. The grafted entry is the redundancy of coding using the model constructed above by grafting the first three symbols of $G_4$ and $G_8$. $G_4$ and $G_8$ are the redundancies of coding only with the Golomb codes of order 4 and 8, respectively. For a relative comparison we use $$\frac{R_{grafted}}{Entropy} = 1.025229 \text{ and } \frac{R_{exponential}}{Entropy} = 1.066514.$$

The grafted model gives 4% improvement over the model based on a single exponential function.

Encoding and Decoding Using a Grafted Codebook

One of the primary advantages of a grafted codebook formed according to embodiments such as described above is that a grafted codebook can model many different types of probability distributions to achieve good compression, while at the same time placing only minimal demands on an encoder and decoder.

Figure 12:
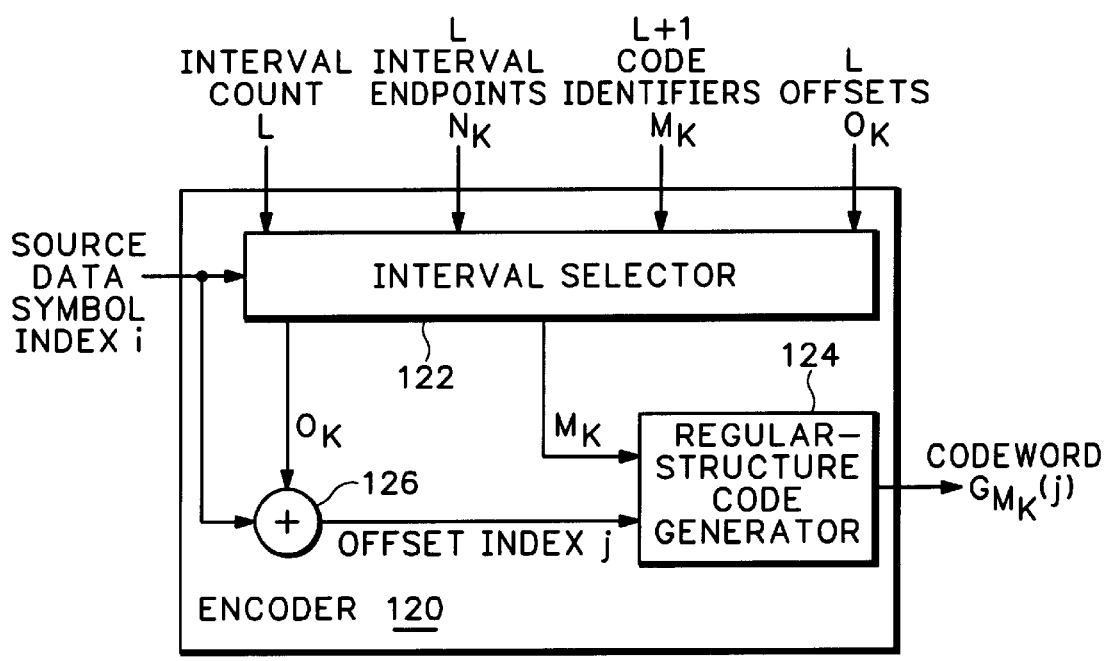
FIG. 12 is a block diagram of an encoder capable of coding symbols according to a grafted codebook.

For instance, consider encoder 120 shown in FIG. 12. Encoder 120 comprises an interval selector 122, a regular-structure code generator 124, and an adder 126. The components of encoder 120 can be implemented in digital logic hardware, in software running on a programmable processor with attached memory, or in some combination of the two. Selection of the appropriate hardware is dependent on the application.

Interval selector 122 is responsible for determining which interval of the grafted codebook is pertinent to a received input symbol with index i. Selector 122 accepts several inputs to allow it to make this determination. First, the number of modeling intervals in the grafted codebook is supplied to selector 122 by the value L (note that a value of L corresponds to L+1 actual modeling intervals). A total of L interval endpoints $N_k$ are also supplied to selector 122 to allow it to know the ranges of each modeling interval. A total of L+1 code family identifiers $G_k$ are supplied to selector 122—the selector associates one of these code family identifiers with each modeling interval. When the code family is the family of Golomb codes, for example, the identifier $G_k$ is equal to m for the desired Golomb code. Finally, a set of L offsets $O_k$ is supplied to interval selector 122.

When a symbol with index i arrives at encoder 20, interval selector 122 compares the symbol to the interval endpoints $N_k$ to find the appropriate interval for the symbol. Once the interval is located, the interval selector outputs the corresponding $G_k$ and $O_k$ values.

Summer 126 adds index i and offset $O_k$ to determine an offset index j. Offset index j is supplied along with $G_k$ to regular-structure code generator 124, which in one embodiment is a generalized Golomb code generator. Code generator 124 outputs the correct grafted codebook codeword for index i.

Figure 13:
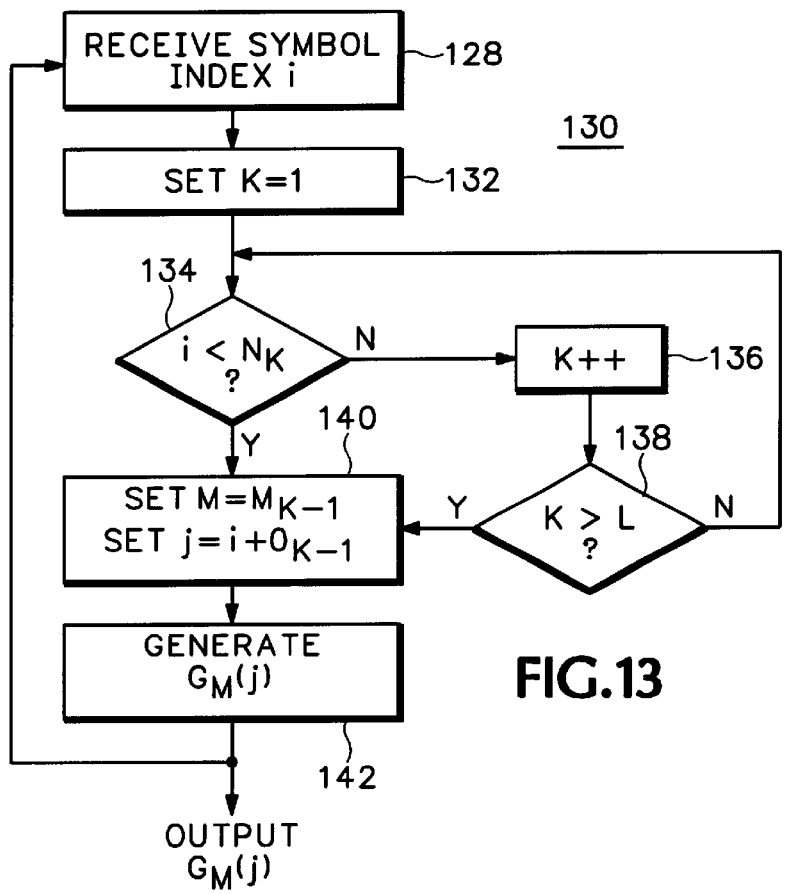
FIG. 13 is a flowchart for the operation of an encoder capable of coding symbols according to a grafted codebook.

FIG. 13 illustrates a flowchart 130 corresponding to one way of performing the functions of encoder 120. At block 128, the encoder receives (or translates, in some embodiments) a symbol of index i. Block 132 sets k=1 in preparation for performing a search of the interval endpoints. Decision block 134 tests i against the currently indexed interval endpoint $N_k$. If i is greater, the correct modeling interval has been found, and control is transferred to block 140. Otherwise, block 136 increments k, and then decision block 138 tests k against L. If k is greater, i lies in the last interval, and control is transferred to block 140. Otherwise, control is transferred back to decision block 134 and the next interval endpoint is tested.

At block 140, the code identifier m is set to the input code identifier $m_{k-1}$. Also, the offset index j is set to i+$O_{k-1}$. The values m and j are then passed to block 142, which generates an output codeword $G_m(j)$ from a regular-structure code family. The system is then ready to process the next symbol index i.

Figure 14:
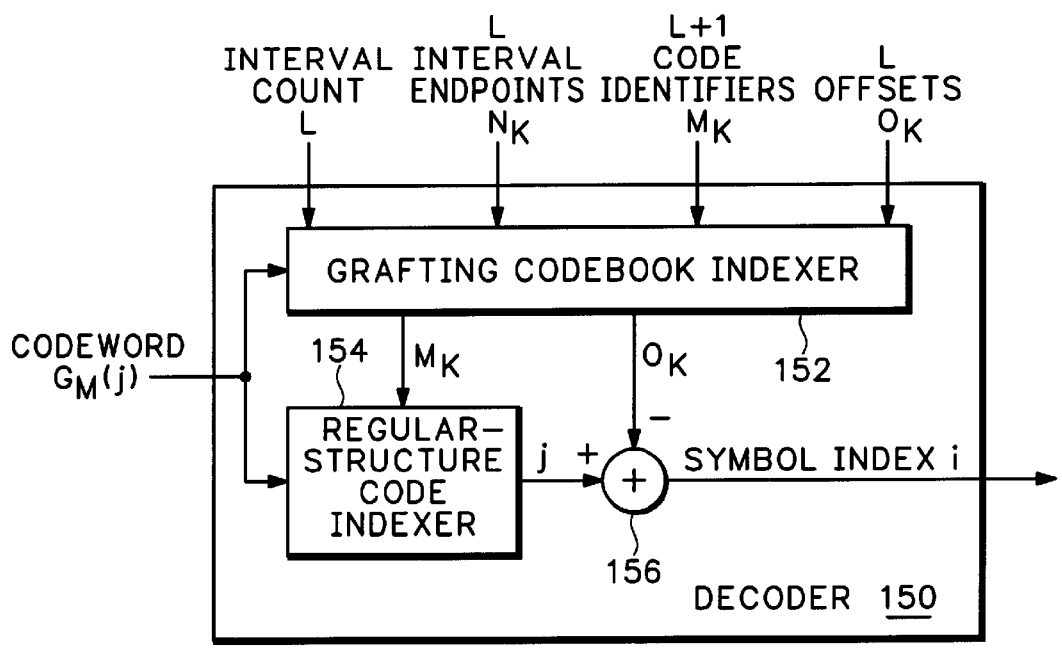
FIG. 14 is a block diagram of a decoder capable of decoding symbols coded using a grafted codebook.

At the receiving end, a decoder must decode the output codeword $G_m(j)$ to determine the symbol index i, reversing the process of the encoder. FIG. 14 shows a block diagram for a decoder 150 designed for this task. Decoder 150 comprises a grafting codebook indexer 152, a regular-structure code indexer 154, and an adder 156. The components of decoder 150 can be implemented in digital logic hardware, in software running on a programmable processor with attached memory, or in some combination of the two. Selection of the appropriate hardware is dependent on the application.

Grafting codebook indexer 152 accepts the same inputs as interval selector 122 of FIG. 12. The task of indexer 152 is somewhat more difficult, however, as at the time a codeword is received the indexer will not know the length of the codeword nor the specific one of the grafted codes used to generate that codeword. Nevertheless, using the prefix of the codeword as a clue, it is possible for the decoder to determine which of the grafted codes generated that codeword. Once this is determined, indexer 152 passes the appropriate code identifier $m_k$ to regular-structure code indexer 154, and passes the appropriate offset $O_k$ to adder 156.

Regular-structure code indexer 154 accepts the input codeword and the code identifier $m_k$. From these, indexer 154 can work backwards in a well-known manner to calculate the offset index j for the codeword. Adder 156 then subtracts offset $O_k$ from offset index j to reconstruct symbol index i.

Figure 15:
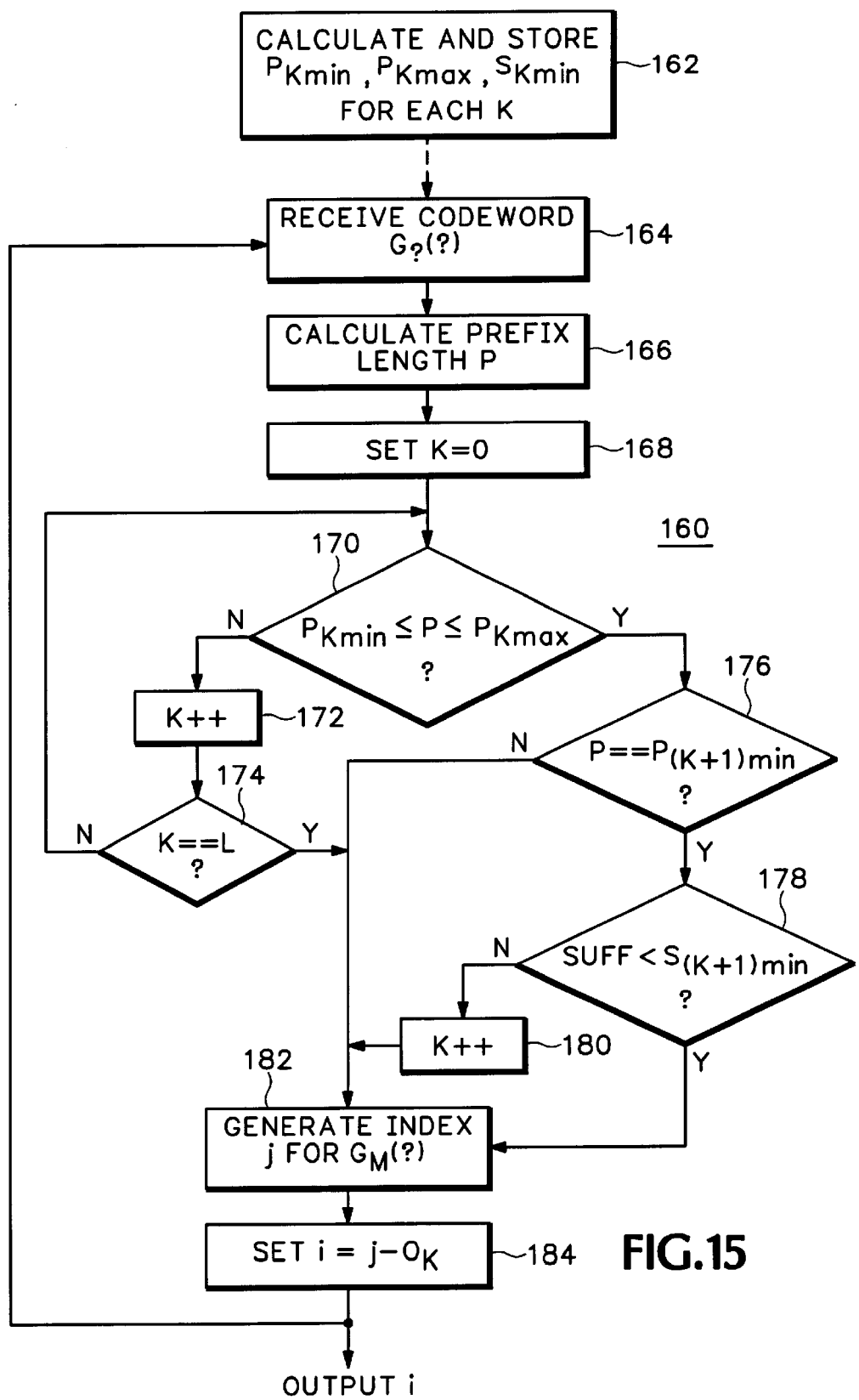
FIG. 15 is a flowchart for the operation of a decoder capable of decoding symbols using a grafted codebook.

Decoder 150 can operate functionally in many different ways to accomplish the same function. One of these ways is illustrated in flowchart 160 of FIG. 15. In FIG. 15, block 162 precalculates a number of constants for later use. For each value of k between 0 and L, inclusive, a value $P_{kmin}$, equal to the minimum prefix length actually used for that value of k in the grafted codebook, is calculated. A similar maximum prefix length value $P_{kmax}$ is calculated as well for each value of k between 0 and L−1, inclusive. Finally, the suffix value for the first codeword actually used with code identifier $m_k$, Ski, is stored as well.

At block 164, a codeword $G_?(?)$ of unknown order and length exists at the head of the codeword bitstream. Block 166 identifies the prefix for the codeword and calculates the prefix length p. Block 168 sets k=0 and then a search for the appropriate index k is begun.

Decision block 170 tests prefix length p to see if it is between $P_{kmin}$ and $P_{kmax}$. If not, block 172 increments k. Another decision block 174 tests the new value of k against the interval count L. If k equals L, the last interval has been reached, and the search can stop. Otherwise, the flowchart branches back to block 170 and the next interval is tested.

If the prefix length p is between $P_{kmin}$ and $P_{kmax}$, the search for k may not be over. It may be possible that prefix length p is shared between two neighboring intervals, in which case the suffix must be examined to determine which value of k is correct. To test whether this process is required, block 176 tests p to see if it is equal to $P_{(k+1)min}$. If not, the prefix length is not shared, and the correct value of k has been located. If block 176 evaluates true, however, control is passed to decision block 178 where the current suffix SUFF is compared to the stored value $S_{(k+1)min}$. If SUFF is less, the correct value of k has been located. If SUFF is greater than or equal, the codeword actually lies in the second of the intervals, and k is incremented accordingly at block 180.

Once k is known, block 182 can generate the offset index j corresponding to the codeword $G_{mk}(?)$ using the now known code identifier $m_k$. Finally, the symbol index i is calculated at block 184 by subtracting offset $O_k$ from offset index j. The value i is output and the process loops back to process the next codeword in the bitstream.

Note that a regular-structure code generator and code indexer refer to an infinite code that has a defined algorithm for calculating a codeword from a symbol index, and vice-versa. A generalized Golomb code generator and code indexer are examples of regular-structure coding devices that accept a Golomb parameter m and can calculate values from a Golomb distribution $G_m$ therefrom.

Not shown in the encoder and decoder is an optional translation table that may be needed in some implementations to translate actual symbols into their respective symbol indices i. It is also noted that the encoder and decoder shown are amenable to use in an adaptive coding process. Note that if a code modeler determines that an adaptation to a new grafted code is advantageous, the adaptation can be implemented by transmitting new values for L, $N_k$, $m_k$, and/or $O_k$ to the encoder and decoder. This adaptation process is much easier and more efficient than calculating and transmitting a whole new non-regular-structure codebook, and is much less error-prone than adaptive methods that track the encoder state from the decoded data.

Coding Results

Figure 11:
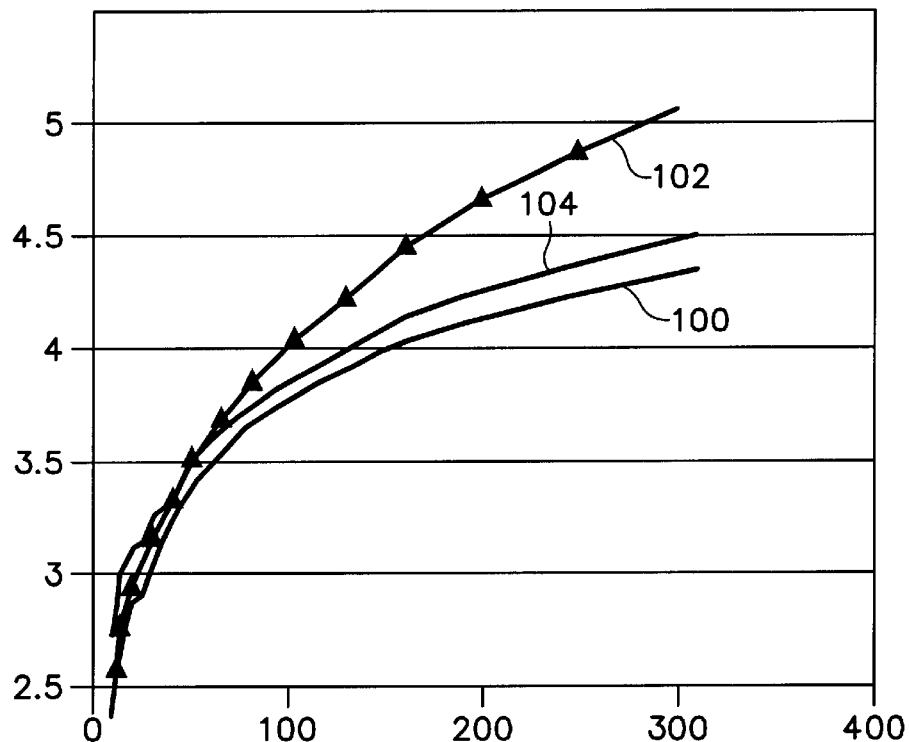
FIG. 11 plots redundancy v. bit-rate for a test video sequence, comparing a universal variable length code against a grafted code generated according to an embodiment of the invention.

The coding gains possible with an embodiment of the invention are illustrated with an example taken from the H.26L video coding test model. The grafted encoder was tested on the video sequence "news" at a range of bit-rates, 10 kbps–320 kbps. In the comparison test model, symbols corresponding to transform coefficients are coded using a universal variable length code (UVLC). A grafted code was constructed from the Golomb codes $G_2$ and $G_8$ for encoding the same transform coefficient symbols. The grafted code was designed using a distribution captured from encoding the sequence "garden" at 300 kbps. The results of both codes are compared with the source entropy in FIG. 11 for a range of bit-rates, where the source entropy of the symbols is shown as line 100, the redundancy of the UVLC is shown as line 102, and the redundancy of the grafted code is shown as line 104. At higher bit-rates the grafted code 104 performs near the lower limit given by the source entropy 100. At very low bit-rates, the UVLC 102 gives some improvement over the grafted code 104, reflecting the fact that the grafted code 104 was designed using a sample distribution corresponding to a high bit-rate source. Similar results are seen using the same grafted code with a variety of video sequences. The grafted code switches between two Golomb codes, therefore the complexity is minimal.

One of ordinary skill in the art will recognize that the concepts taught herein can be tailored to a particular application in many other advantageous ways. In particular, those skilled in the art will recognize that the illustrated embodiments are but one of many alternative implementations that will become apparent upon reading this disclosure. For instance, a more general family of model distributions can be used. Other families of infinite codes than the Golomb codes can be used, such as exponential codes, or codes from more than one family can be grafted. Such minor modifications are encompassed within the invention, and are intended to fall within the scope of the claims.

The preceding embodiments are exemplary. Although the specification may refer to "an", "one", "another", or "some" embodiment(s) in several locations, this does not necessarily mean that each such reference is to the same embodiment(s), or that the feature only applies to a single embodiment.

What is claimed is:

1. A method of constructing a computer-readable codebook for a sequence of symbols, the method comprising:

dividing the probability distribution p(i) of the symbols contained in the sequence of symbols into L+1 mutually exclusive modeling intervals $I_k$, where L>0 and $0 \leq k \leq L$;

associating an infinite code $C_k(i)$ with each modeling interval $I_k$, each code $C_k(i)$ capable of representing each possible symbol in the sequence;

selecting first codewords from $C_0(i)$ for use in representing symbols present in the first modeling interval $I_0$;

for modeling intervals $I_k$ where k>0, selecting codewords from infinite code $C_k(i)$ for use in representing symbols present in that modeling interval, wherein those codewords are selected by calculating an offset $O_k$ into infinite code $C_k(i)$ such that the cumulative probability of the codewords selected for all modeling intervals is one;

grafting the codewords selected for all modeling intervals together into a single grafted codebook; and storing parameters describing the grafted codebook to computer-readable media.

2. The method of claim 1, wherein associating the L+1 infinite codes $C_k(i)$ with the L+1 modeling intervals $I_k$ comprises selecting a set of $L+_1$ model distributions $m_k(i)$ from a larger set of candidate distributions by minimizing the function $$R_k = \sum_{i=N_k}^{i<N_{k+1}} -p(i) \cdot \log_2(m_k(i)) \text{ subject to the constraints:}$$

$$\forall k \sum_{i=-\infty}^{\infty} m_k(i) = 1$$

$$\sum_{k=0}^{k=L} \sum_{i=N_{k-1}}^{i<N_k} m_k(i) = 1.$$

3. The method of claim 2, wherein the model distributions $m_k(i)$ are selected from the family of one-sided exponential distributions.

4. The method of claim 3, wherein the infinite codes $C_k(i)$ are selected from the family of Golomb codes $\{G_m(i)\}$.

5. The method of claim 1, wherein the infinite codes $C_k(i)$ are selected from the family of Golomb codes $\{G_m(i)\}$.

6. The method of claim 1, wherein calculating an offset $O_k$ into infinite code $C_k(i)$ comprises solving for the value of $O_k$ in:

$$\sum_{i=0}^{i<N_k+O_k} \left(\frac{1}{2}\right)^{\|C_k(i+O_k)\|} = \sum_{j=0}^{j=k-1} \sum_{i=N_j}^{i<N_{j+1}} \left(\frac{1}{2}\right)^{\|C_j(i+O_j)\|}.$$

7. The method of claim 1, wherein L=1, wherein associating an infinite code with modeling interval $I_0$ comprises selecting a Golomb code having the best fit of the Golomb code family to the first n values of p(i), and wherein associating an infinite code with modeling interval $I_1$ comprises selecting a Golomb code having the best fit of the Golomb code family to the slope of the remaining values of p(i).

8. A computer apparatus for constructing a grafted codebook for a sequence of symbols, the apparatus comprising:

a distribution modeler to model an input probability distribution as a piecewise decomposed function built from a set of model distributions, one model distribution for each of a plurality of intervals defined on the piecewise decomposed function;

a model codebook generator to generate a set of infinite codebooks corresponding respectively to the model distributions; and a codebook grafter to graft the set of codebooks into a single grafted codebook based on the piecewise decomposition of the original probability distribution.

9. The computer apparatus of claim 8, wherein the distribution modeler determines interval endpoints for the intervals represented by the piecewise decomposition of the original probability distribution.

10. The computer apparatus of claim 8, wherein the model codebook generator generates the set of infinite codebooks from the family of Golomb codes.

11. The computer apparatus of claim 8, wherein the codebook grafter calculates an offset into a codebook from the set of codebooks.

12. An entropy coding processor for encoding symbols from a source data stream, comprising:

an interval selector to determine, from a set of L+1 source index intervals L>1, the interval k corresponding to a current symbol i from the source data stream, thereby also determining a code identifier $m_k$ and an offset $O_k$ corresponding to interval k;

an offset index generator to calculate an offset index j from offset $O_k$ and symbol i; and a regular-structure code generator to calculate an output codeword given the code identifier $m_k$ and the offset index j.

13. The entropy coding processor of claim 12, wherein the code identifiers $m^k$ and offsets $O_k$ are programmable inputs to the entropy coding processor.

14. The entropy coding processor of claim 13, wherein the source index intervals are defined by a set of L interval endpoints $N_k$, and wherein the interval endpoints are programmable inputs to the entropy coding processor.

15. The entropy coding processor of claim 14, wherein L is a programmable input to the entropy coding processor.

16. The entropy coding processor of claim 12, wherein symbol i is a symbol index for an input symbol from the source data stream.

17. The entropy coding processor of claim 12, wherein the regular-structure code generator is a generalized Golomb code generator.

18. The entropy coding processor of claim 12, wherein the code identifier $m_k$ is the m-parameter for a Golomb code.

19. An entropy decoding processor for decoding variable-length codewords from a compressed data stream, comprising:

a grafting codebook indexer to determine, from a set of L+1 grafted codebooks, L≧1, the code identifier $m_k$ for the code used to generate a current codeword G, thereby also determining an offset $O_k$ corresponding to code identifier $m_k$;

a regular-structure code indexer to calculate an offset index j for codeword G given code identifier $m_k$; and an offset remover to calculate a symbol index i corresponding to codeword G from offset $O_k$ and offset index j.

20. The entropy decoding processor of claim 19, wherein the code identifiers $m_k$ and offsets $O_k$ are programmable inputs to the entropy decoding processor.

21. The entropy decoding processor of claim 20, wherein L is a programmable input to the entropy decoding processor.

22. The entropy decoding processor of claim 19, wherein the regular-structure code indexer is a generalized Golomb code indexer.

23. The entropy decoding processor of claim 19, wherein the code identifier $m_k$ is the m-parameter for a Golomb code.

24. A method of encoding, in a digital processor, symbol indices corresponding to a source data stream, comprising:

defining a set of infinite codes on a set of source index intervals, one code per interval;

defining a set of offsets corresponding respectively to the source index intervals;

for a symbol index i, determining a current interval, from the set of source index intervals, that includes symbol index i;

forming an offset symbol index j by adding the offset corresponding to the current interval to i; and generating the codeword corresponding to offset symbol index j from the infinite code corresponding to the current interval.

25. A method of decoding, in a digital processor, variable-length codewords generated from a grafted codebook of infinite codes, comprising:

defining a set of infinite codes on a set of source index intervals, one code per interval;

defining a set of offsets corresponding respectively to the source index intervals;

for a codeword G, examining the prefix of that codeword to determine a current code, from the set of infinite codes, that generated codeword G;

calculating an offset symbol index j corresponding to codeword G and the current code; and calculating a symbol index i for codeword G by subtracting the offset corresponding to the current code from the offset symbol index j.

* * * * *

UNITED STATES PATENT AND TRADEMARK OFFICE
CERTIFICATE OF CORRECTION

PATENT NO.    : 6,622,145 B2
DATED         : September 16, 2003
INVENTOR(S)   : Kerofsky It is certified that error appears in the above-identified patent and that said Letters Patent is hereby corrected as shown below:

Title page,
Item [56], References Cited, U.S. PATENT DOCUMENTS, should include:

| -- Document Number | Issue Date | Name | Class | Sub-Class |
|---|---|---|---|---|
| 6,041,302 | 03/21/00 | Bruekers | 704 | 503 |
| 6,075,470 | 06/13/00 | Little et al. | 341 | 107 |
| 5,999,111 | 12/07/99 | Park et al. | 341 | 67 |
| 4,700,175 | 10/13/87 | Bledsoe | 340 | 347 |
| 4,560,976 | 12/24/85 | Finn | 340 | 347 --. |

OTHER PUBLICATIONS, should include:
-- Huffman, David A.; "A Method for the Construction of Minimum-Redundancy Codes," Proc. of the IRE, Vol. 40(10); September 1952; pp. 1098-1101.
Golomb, S.W.; "Run length encodings," IEEE Trans. Inform. Theory, Vol. 12; July 1966; pp. 399-401.
Gallager, R. and Van Voorhis, D.C.; "Optimal source codes for geometrically distributed integer alphabets," IEEE Trans. Inform. Theory, Vol. 21; March 1975; pp. 228-230.
Kato, A., Han, T.S., and Nagaoko, H.; "Huffman Coding with an Infinite Alphabet," IEEE Trans. Inform. Theory, Vol. 42; May 1996; pp. 977-984.
Merhav, N., Seroussi, G., and Weinberger, M.; "Optimal Prefix Codes for Sources with Two-Sided Geometric Distributions," IEEE Trans. Inform Theory, vol. 46; January 2000; pp. 121-135.
Merhav, N., Seroussi, G., and Weinberger, M.; "Algorithm: Principles and Standardization into JPEG-LS," IEEE Trans. Image Processing, Vol. 9, No. 8; August 2000; pp. 1309-1324.
Bjontegaard, Gisle; "H.26L Test Model Long Term number 3 (TML-3) draft 0," Q15-J-08, Osaka, Japan, May 2000. --.

Column 7,
Line 28, "offset $O_1$ the" should read -- offset $O_1$ is the --.

Column 9,
Line 34, "starting the seventh" should read -- starting with the seventh --.

Column 12,
Line 6, "$m_k$, Ski, is" should read -- $m_k$, $S_{kmin}$, is --.

UNITED STATES PATENT AND TRADEMARK OFFICE
CERTIFICATE OF CORRECTION

PATENT NO. : 6,622,145 B2
DATED : September 16, 2003
INVENTOR(S) : Kerofsky

It is certified that error appears in the above-identified patent and that said Letters Patent is hereby corrected as shown below:

Column 13,
Line 65, "of $L +_1$ model" should read -- of $L + 1$ model --.

Column 14,
Line 21, "code $C_k((i)$ comprises" should read -- code $C_k(i)$ comprises --.
Line 64, "intervals L>1, the" should read -- intervals, $L \geq 1$, the --.

Column 15,
Line 7, "identifiers $m^k$ and" should read -- identifiers $m_k$ and --.

Signed and Sealed this

Sixth Day of July, 2004

JON W. DUDAS
*Acting Director of the United States Patent and Trademark Office*